United States Patent

Sugawara

(10) Patent No.: US 9,312,444 B2
(45) Date of Patent: Apr. 12, 2016

(54) SEMICONDUCTOR LIGHT EMITTING DEVICE AND MANUFACTURING METHOD THEREOF

(71) Applicant: Kabushiki Kaisha Toshiba, Tokyo (JP)

(72) Inventor: Hideto Sugawara, Ishikawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 236 days.

(21) Appl. No.: 13/787,739

(22) Filed: Mar. 6, 2013

(65) Prior Publication Data

US 2014/0061660 A1 Mar. 6, 2014

(30) Foreign Application Priority Data

Aug. 30, 2012 (JP) .................................. 2012-190475

(51) Int. Cl.
| | |
|---|---|
| H01L 33/32 | (2010.01) |
| H01L 21/18 | (2006.01) |
| H01L 33/00 | (2010.01) |
| H01L 21/20 | (2006.01) |
| H01L 33/02 | (2010.01) |

(52) U.S. Cl.
CPC .............. *H01L 33/32* (2013.01); *H01L 33/007* (2013.01); *H01L 33/0079* (2013.01); *H01L 33/02* (2013.01)

(58) Field of Classification Search
CPC . H01L 33/32; H01L 21/0254; H01L 33/0079; H01L 2924/12041; H01L 33/0025; H01L 33/0062; H01L 33/0066; H01L 33/30–33/325; H01L 33/508; H01L 21/185; H01L 21/187; H01L 21/20; H01L 21/2003; H01L 21/2036; H01L 21/2056; H01L 21/2085; C30B 25/02
See application file for complete search history.

(56) References Cited

U.S. PATENT DOCUMENTS

| | | | | |
|---|---|---|---|---|
| 5,459,746 A | * | 10/1995 | Itaya et al. | 372/50.11 |
| 5,466,950 A | * | 11/1995 | Sugawara et al. | 257/94 |
| 5,693,963 A | * | 12/1997 | Fujimoto et al. | 257/94 |
| 5,932,896 A | * | 8/1999 | Sugiura et al. | 257/94 |
| 5,981,977 A | * | 11/1999 | Furukawa et al. | 257/94 |
| 6,002,700 A | * | 12/1999 | Sato | 372/45.01 |
| 6,017,807 A | * | 1/2000 | Furukawa et al. | 438/502 |
| 6,153,010 A | * | 11/2000 | Kiyoku et al. | 117/95 |
| 6,232,137 B1 | * | 5/2001 | Sugawara et al. | 438/46 |
| 6,337,493 B1 | * | 1/2002 | Tanizawa et al. | 257/79 |
| 6,359,292 B1 | * | 3/2002 | Sugawara et al. | 257/103 |
| 6,538,265 B1 | * | 3/2003 | Sugawara | 257/103 |

(Continued)

FOREIGN PATENT DOCUMENTS

| | | |
|---|---|---|
| JP | 2006-324697 | 11/2006 |
| JP | 2010212401 A | 9/2010 |
| JP | 2011525708 A | 9/2011 |

OTHER PUBLICATIONS

Japanese Office Action dated May 19, 2015, filed in Japanese counterpart Application No. 2012-190475, 6 pages (with translation).

*Primary Examiner* — William F Kraig
*Assistant Examiner* — Maliheh Malek
(74) *Attorney, Agent, or Firm* — Patterson & Sheridan, LLP

(57) ABSTRACT

A semiconductor light emitting device includes a supporting substrate, a light emitting layer including a nitride semiconductor, and a nitride multilayer film. The nitride multilayer film includes a first layer including a first nitride semiconductor containing aluminum nitride, a second layer including a second nitride semiconductor containing gallium nitride, and a third layer including the first nitride semiconductor containing aluminum nitride.

20 Claims, 5 Drawing Sheets

(56) References Cited

U.S. PATENT DOCUMENTS

| | | | | |
|---|---|---|---|---|
| 6,611,003 B1* | 8/2003 | Hatakoshi et al. | | 257/98 |
| 7,193,246 B1* | 3/2007 | Tanizawa et al. | | 257/94 |
| 7,576,363 B2* | 8/2009 | Uemura et al. | | 257/94 |
| 7,791,101 B2* | 9/2010 | Bergmann et al. | | 257/103 |
| 8,044,384 B2* | 10/2011 | Bergmann | H01L 21/0237 | |
| | | | | 257/13 |
| 8,093,625 B2* | 1/2012 | Shim | | 257/190 |
| 8,304,805 B2* | 11/2012 | Lochtefeld | | 257/103 |
| 8,323,402 B2* | 12/2012 | Tanizaki et al. | | 117/7 |
| 8,575,592 B2* | 11/2013 | Bergmann et al. | | 257/13 |
| 8,604,461 B2* | 12/2013 | Driscoll et al. | | 257/15 |
| 8,664,679 B2* | 3/2014 | Yan et al. | | 257/98 |
| 8,772,757 B2* | 7/2014 | Emerson et al. | | 257/13 |
| 8,816,319 B1* | 8/2014 | Raring et al. | | 257/9 |
| 8,916,906 B2* | 12/2014 | Fenwick | | 257/190 |
| 8,957,440 B2* | 2/2015 | Ibbetson et al. | | 257/98 |
| 2002/0036295 A1* | 3/2002 | Nunoue et al. | | 257/98 |
| 2002/0139984 A1* | 10/2002 | Sugawara et al. | | 257/79 |
| 2002/0155712 A1* | 10/2002 | Urashima et al. | | 438/689 |
| 2002/0158253 A1* | 10/2002 | Moku et al. | | 257/76 |
| 2003/0080344 A1* | 5/2003 | Yoo | | 257/103 |
| 2004/0206966 A1* | 10/2004 | Sugawara et al. | | 257/85 |
| 2005/0042845 A1* | 2/2005 | Urbanek | | 438/483 |
| 2005/0161697 A1* | 7/2005 | Nakahata et al. | | 257/103 |
| 2005/0227453 A1* | 10/2005 | Miki et al. | | 438/438 |
| 2006/0006500 A1* | 1/2006 | Piner et al. | | 257/613 |
| 2006/0165963 A1* | 7/2006 | Fleury et al. | | 428/212 |
| 2006/0226414 A1* | 10/2006 | Oshima | | 257/11 |
| 2006/0231862 A1* | 10/2006 | Otsuka | H01L 29/7376 | |
| | | | | 257/197 |
| 2007/0101932 A1* | 5/2007 | Schowalter et al. | | 117/952 |
| 2007/0108456 A1* | 5/2007 | Wong | B82Y 20/00 | |
| | | | | 257/94 |
| 2008/0054248 A1* | 3/2008 | Chua | B82Y 20/00 | |
| | | | | 257/14 |
| 2008/0217622 A1* | 9/2008 | Goyal | | 257/64 |
| 2008/0274574 A1* | 11/2008 | Yun | | 438/47 |
| 2009/0085056 A1* | 4/2009 | Kumtornkittikul | | 257/103 |
| 2009/0206354 A1* | 8/2009 | Kitano et al. | | 257/98 |
| 2010/0075175 A1* | 3/2010 | Poblenz et al. | | 428/697 |
| 2010/0078659 A1* | 4/2010 | Iizuka et al. | | 257/94 |
| 2010/0207146 A1* | 8/2010 | Iizuka et al. | | 257/98 |
| 2010/0313875 A1* | 12/2010 | Kennedy | | 126/652 |
| 2010/0314653 A1* | 12/2010 | Orita | B82Y 20/00 | |
| | | | | 257/98 |
| 2010/0327298 A1* | 12/2010 | Konno et al. | | 257/94 |
| 2011/0042696 A1* | 2/2011 | Smith et al. | | 257/89 |
| 2011/0073838 A1* | 3/2011 | Khan et al. | | 257/13 |
| 2011/0127489 A1* | 6/2011 | Lee et al. | | 257/13 |
| 2011/0260177 A1* | 10/2011 | Sakurai | | 257/79 |
| 2011/0268941 A1* | 11/2011 | Fischer et al. | | 428/213 |
| 2012/0028009 A1* | 2/2012 | Gerardin et al. | | 428/212 |
| 2012/0037881 A1* | 2/2012 | Kim | H01L 33/007 | |
| | | | | 257/13 |
| 2012/0058626 A1* | 3/2012 | Sugiyama et al. | | 438/478 |
| 2012/0074385 A1* | 3/2012 | Tak | H01L 21/02381 | |
| | | | | 257/15 |
| 2012/0146045 A1* | 6/2012 | Sugiyama et al. | | 257/76 |
| 2012/0177900 A1* | 7/2012 | Laurent et al. | | 428/213 |
| 2012/0217531 A1* | 8/2012 | Katsuno et al. | | 257/99 |
| 2012/0228654 A1* | 9/2012 | Fujimoto et al. | | 257/98 |
| 2012/0267641 A1* | 10/2012 | Huo et al. | | 257/76 |
| 2012/0292631 A1* | 11/2012 | Katsuno et al. | | 257/76 |
| 2012/0292632 A1* | 11/2012 | Shioda et al. | | 257/76 |
| 2012/0295377 A1* | 11/2012 | Sato et al. | | 438/29 |
| 2012/0299143 A1* | 11/2012 | Stern | | 257/437 |
| 2012/0319080 A1* | 12/2012 | Fudeta et al. | | 257/13 |
| 2012/0320642 A1* | 12/2012 | Imanishi | | 363/37 |
| 2013/0001509 A1* | 1/2013 | Fudeta | H01L 33/04 | |
| | | | | 257/13 |
| 2013/0032810 A1* | 2/2013 | Chen | | 257/76 |
| 2013/0069033 A1* | 3/2013 | Kushibe et al. | | 257/13 |
| 2013/0078750 A1* | 3/2013 | Yeo et al. | | 438/29 |
| 2013/0119424 A1* | 5/2013 | Kang | H01L 33/60 | |
| | | | | 257/98 |
| 2013/0228742 A1* | 9/2013 | Tanaka et al. | | 257/13 |
| 2013/0228745 A1* | 9/2013 | Ono et al. | | 257/13 |
| 2013/0234178 A1* | 9/2013 | Mitsugi et al. | | 257/94 |
| 2014/0054542 A1* | 2/2014 | Han | H01L 33/12 | |
| | | | | 257/13 |
| 2014/0134765 A1* | 5/2014 | Chen | | 438/27 |
| 2014/0252310 A1* | 9/2014 | Ono et al. | | 257/13 |
| 2014/0252382 A1* | 9/2014 | Hashimoto et al. | | 257/88 |
| 2014/0367722 A1* | 12/2014 | Im | H01L 33/20 | |
| | | | | 257/98 |

\* cited by examiner

SEMICONDUCTOR LIGHT EMITTING DEVICE AND MANUFACTURING METHOD THEREOF

CROSS-REFERENCE TO RELATED APPLICATION

This application is based upon and claims the benefit of priority from Japanese Patent Application No. 2012-190475, filed Aug. 30, 2012; the entire contents of which are incorporated herein by reference.

FIELD

Embodiments described herein relate to a semiconductor light emitting device and a manufacturing method thereof.

BACKGROUND

In recent years, the semiconductor light emitting devices using the InAlGaN-type or other nitride semiconductors have been developed. Since the optical transition is of a direct transition-type, a light emitting element having a nitride semiconductor can achieve high efficiency in the light emitting recombination and high luminance. Furthermore, since the transition energy is wide at 2-6.2 eV, it is suitable for a variety of applications. For example, the band gap energy of $In_yGa_{1-y}N$ can be changed from 3.4 eV of GaN to 2 eV of InN by the selection of the value of the composition y of indium. Thus, by the combination of the light emitting element with the fluorescent material having the InGaN layer as the light emitting layer, a white light source can be realized. Such a white light source can be used as a back light of a liquid crystal panel or a light source for illumination.

The thin film type LED (Light Emitting Diode) has been known as a type of the semiconductor light emitting devices that use nitride semiconductors. The thin film type LED is prepared by growing a light emitting layer including a nitride semiconductor on a substrate for crystal growth and, after pasting a supporting substrate on top of it, removing the substrate for crystal growth. It is preferable that, on the substrate for crystal growth, from the viewpoint of the crystal growth, a nitride semiconductor having the same properties as the light emitting layer is used. However, as the nitride semiconductor substrate, the material with the presence of the GaN substrate is expensive and it is difficult to apply it for industrial use. The sapphire substrate is stable in the crystal growing atmosphere and, since a small-diameter wafer is available at a relatively low manufacturing cost, it is often used at present. However, since the sapphire substrate has a large non-matching characteristic of the crystal lattice with the nitride semiconductor layer and also has a large difference in the thermal expansion coefficient, many crystal defects are formed on the nitride semiconductor layer grown on the sapphire substrate. Furthermore, since a large-diameter sapphire substrate is expensive, there is also a limit in manufacturing cost reduction of the semiconductor light emitting device.

DETAILED DESCRIPTION

A semiconductor light emitting device having high performance characteristics and a low manufacturing cost, and a manufacturing method thereof, are provided. Embodiments, with reference to the drawings, are described below.

A method of manufacturing the semiconductor light emitting device according to an embodiment comprises performing epitaxial growth of a nitride multilayer film on top of a substrate for crystal growth including silicon or silicon nitride, forming a light emitting layer including a nitride semiconductor on top of the nitride multilayer film, joining a laminate including the substrate for crystal growth, the nitride multilayer film and the light emitting layer to a supporting substrate from a side of the light emitting layer, and removing the substrate for crystal growth. The nitride multilayer film includes a first layer including a first nitride semiconductor containing aluminum, a second layer including a second nitride semiconductor having a refractive index different from the refractive index of the first nitride semiconductor, and a third layer including the first nitride semiconductor containing aluminum. In the process for the epitaxial growth of the nitride multilayer film, forming of pairs of the first layer and the second layer are repeated for k times (k is an integer of 1 or more), and then the process of forming the third layer is carried out. Alternatively, after carrying out the process of forming the third layer, the process of forming the second layer and the process of forming the first layer are repeated alternately for k times.

The semiconductor light emitting device according to one embodiment includes the supporting substrate, the light emitting layer including the nitride semiconductor formed on top of the supporting substrate, and the nitride multilayer film formed on top of the light emitting layer. The nitride multilayer film has the first layer including the first nitride semiconductor containing aluminum, the second layer including the second nitride semiconductor having a refractive index different from the refractive index of the first nitride semiconductor, and the third layer including the first nitride semiconductor. In the nitride multilayer film, the pair including the first layer and the second layer is laminated for k times (k is an integer of 1 or more). On top of the exposed surface of the second layer of the laminated body, one layer of the third layer is laminated.

A first embodiment is described below.

Figure 1A:
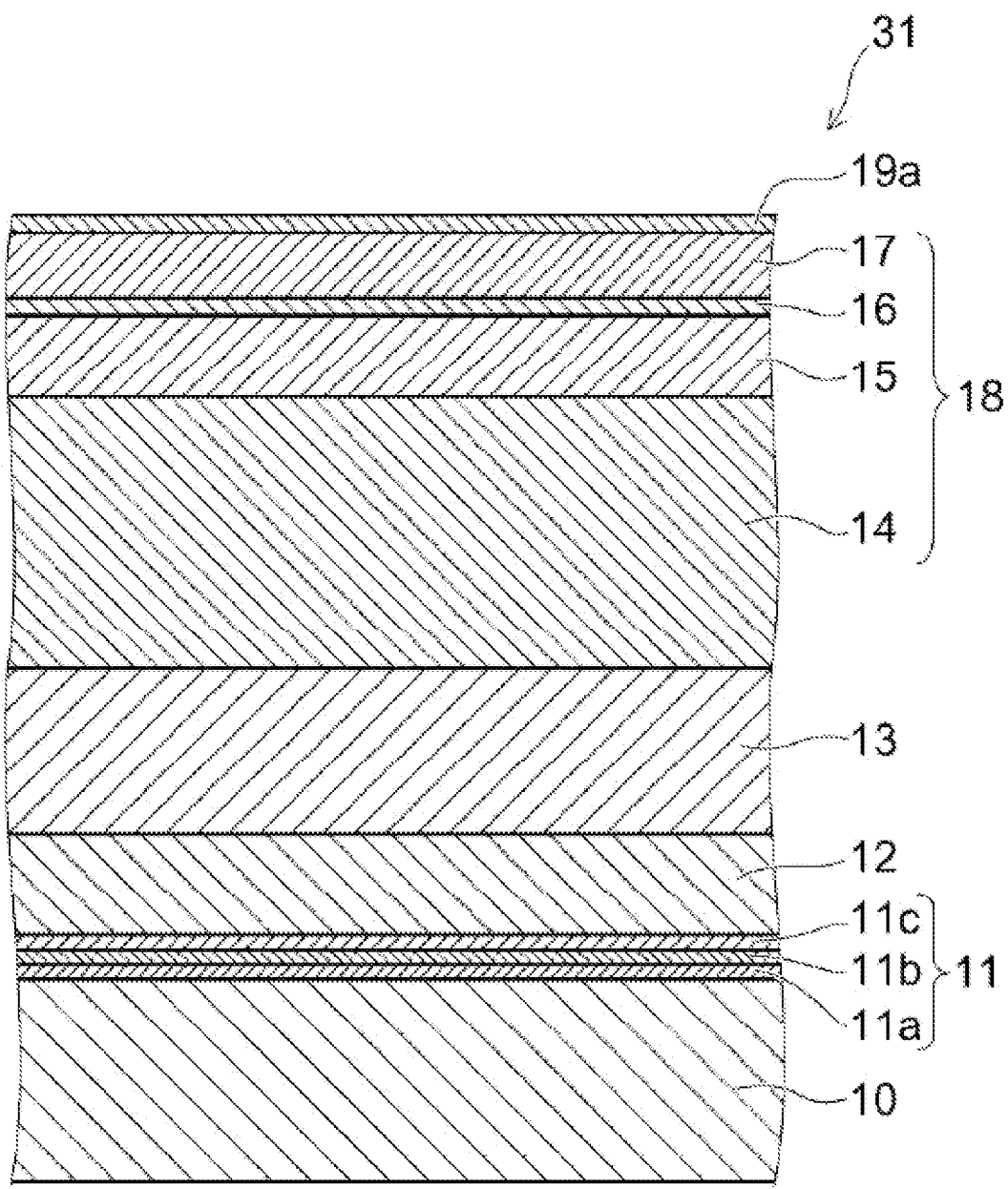
FIG. 1A is a cross-sectional diagram illustrating a method of manufacturing a semiconductor light emitting device according to an embodiment.
Figure 1B:
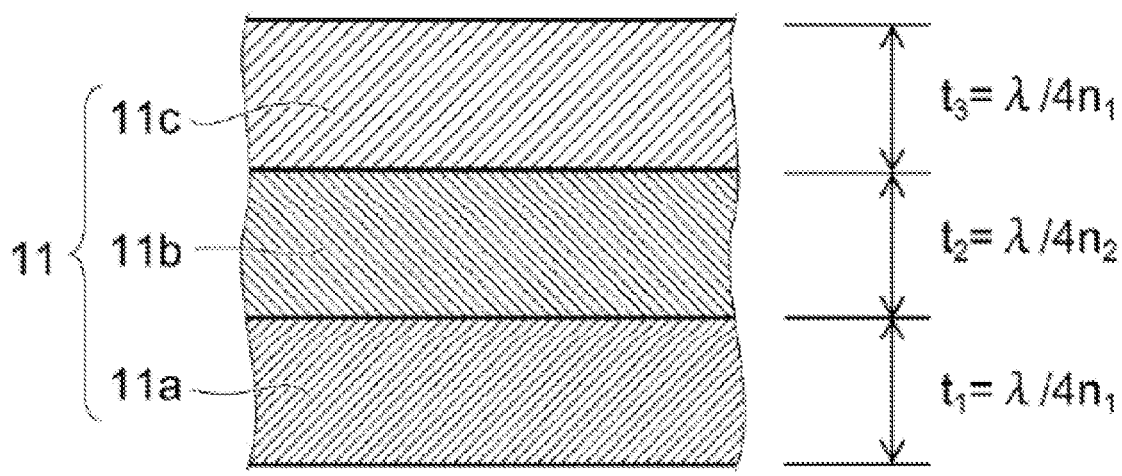
FIG. 1B is a cross-sectional diagram illustrating the nitride multilayer film shown in FIG. 1A.

FIG. 1A is a cross-sectional diagram illustrating a method of manufacturing a semiconductor light emitting device according to the first embodiment, and FIG. 1B is a cross-sectional diagram illustrating a nitride multilayer film shown in FIG. 1A.

Figure 2A:
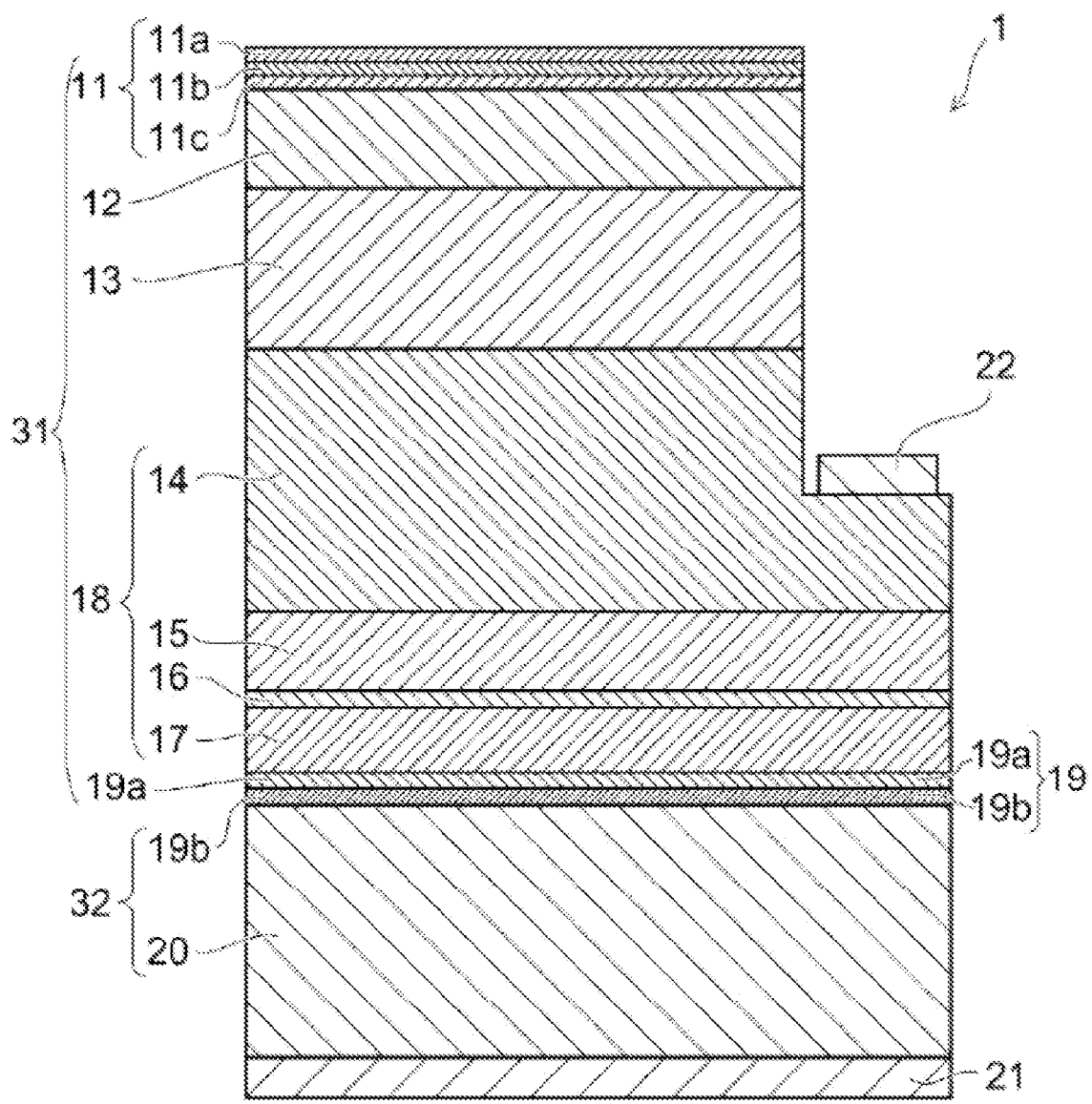
FIG. 2A is a cross-sectional diagram illustrating a semiconductor light emitting device according to an embodiment.
Figure 2B:
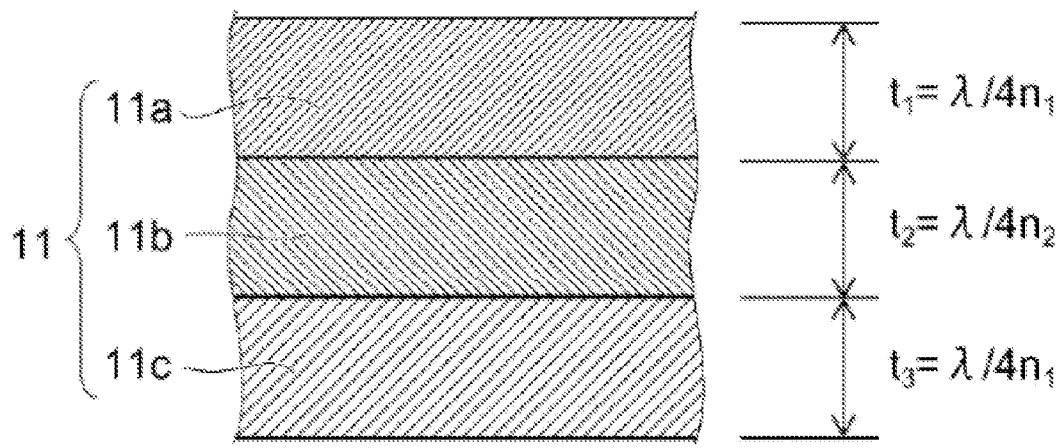
FIG. 2B is a cross-sectional diagram illustrating the nitride multilayer film shown in FIG. 2A.

FIG. 2A is a cross-sectional diagram illustrating the semiconductor light emitting device according to the first embodiment, and FIG. 2B is a cross-sectional diagram illustrating the nitride multilayer film shown in FIG. 2A. Note the layers of FIG. 2A are illustrated upside-down relative to the layers of FIG. 1A, and the layers of FIG. 2B are illustrated upside-down relative to the layers of FIG. 1B.

A method of manufacturing the semiconductor light emitting device according to the first embodiment is described below. In the explanation of the manufacturing method, for convenience sake, the layer formed afterward is referred to as the "upper" layer, relative to the layer formed first.

As shown in FIG. 1A, as the substrate for crystal growth, the silicon wafer 10 is prepared. Next, as shown in FIG. 1A and FIG. 1B, for example, by the organic metal vapor phase deposition method (e.g., metal organic chemical vapor deposition (MOCVD)), on top of the silicon wafer 10, the buffer AlN layer 11a including aluminum nitride (AlN) is subjected to epitaxial growth. At this time, as the raw material gas, first of all, by supplying TMA (Trimethyl Aluminum: $Al(CH_3)_3$), the aluminum layer (not shown in the drawing) of the single atom layer is formed on top of the silicon wafer 10. In doing so, it can suppress the decomposition of the silicon wafer 10 by the ammonia $NH_3$ to be used as the raw material gas in the film formation afterwards. Furthermore, diffusion of silicon can be suppressed.

Next, by supplying ammonia as the raw material gas, the nitrogen layer (not shown in the drawing) of the single atom layer is formed. Next, while the ammonia is being supplied continuously, TMA is supplied intermittently. Afterwards, by continuously supplying the ammonia and the TMA at the same time, the AlN layer is grown. In doing so, the buffer AlN layer 11a is formed. The thickness of the buffer AlN layer 11a is, for example, 52 nm.

Next, by the MOCVD method, the un-doped GaN layer 11b including the gallium nitride (GaN) without the introduction of the impurity is subjected to epitaxial growth. The thickness of the un-doped GaN layer 11b is, for example, 46 nm.

Next, by the MOCVD method, the AlN layer 11c including the aluminum nitride (AlN) is subjected to epitaxial growth. The thickness of the AlN layer 11c is, for example, 52 nm.

In doing so, the nitride multilayer 11 by the lamination of the buffer AlN layer 11a, the un-doped GaN layer 11b and the AlN layer 11c in sequence is formed. The nitride multilayer 11 is a layer by epitaxial growth in a continuous manner as a whole. This is the underlying film of the laminate including the nitride semiconductor formed afterwards.

Next, by the MOCVD method, the un-doped GaN layer 12, the intermediate layer 13, the n-type GaN contact and the clad layer 14, the light emitting layer 15, the p-type AlGaN electron overflow preventing and cladding layer 16, and the p-type GaN contact layer 17 are formed. Among these, by the n-type GaN contact and clad layer 14, the light emitting layer 15, the p-type AlGaN electron overflow preventing and cladding layer 16, and the p-type GaN contact layer 17, the LED film 18 including the nitride semiconductors is constituted. As the light emitting layer 15, for example, the InGaAlN layer is formed. Furthermore, the nitride multilayer 11, the un-doped GaN layer 12 and the intermediate layer 13 are the buffer layers for controlling the lattice distortion between the silicon wafer 10 and the LED film 18. In particular, the intermediate layer 13 inhibits the propagation to the LED film 18, of the defect formed on the un-doped GaN layer 12 due to the non-matching characteristic with the silicon wafer 10. As the intermediate layer 13, for example, the super lattice layer including GaN and InGaN is formed.

Next, on top of the p-type GaN contact layer 17, for example, the metal layer for bonding 19a including gold (Au) is formed. In doing so, on top of the silicon wafer 10, the intermediate laminate 31 by the lamination of the nitride multilayer 11, the un-doped GaN layer 12, the intermediate layer 13, the n-type GaN contact and clad layer 14, the light emitting layer 15, the p-type AlGaN electron overflow preventing and cladding layer 16, the p-type GaN contact layer 17 and the metal layer for bonding 19a is prepared in this sequence.

On the other hand, as shown in FIG. 2A, for example, on top of the supporting substrate 20 including copper (Cu), for example, the metal layer for bonding 19b including gold (Au) is formed. In doing so, the intermediate laminate 32 by the formation of the metal layer for bonding 19b on the supporting substrate 20 is formed.

Then, the intermediate laminate 31 and the intermediate laminate 32 are overlapped so that the metal layer for bonding 19a and the metal layer for bonding 19b are mutually contacted. Next, for example, by carrying out a heating treatment, the metal layer for bonding 19a and the metal layer for bonding 19b are mutually bonded. In doing so, the supporting substrate 20 is coated on the side of the LED film 18 of the intermediate laminate 31. At this time, the metal layers for bonding 19a and 19b are integrated to yield the bonding layer 19.

Next, for example, by wet etching, the silicon wafer 10 as the substrate for crystal growth is removed. In doing so, the buffer AlN layer 11a of the nitride multilayer film 11 is exposed.

Next, for example, by dry etching, the nitride multilayer 11, the un-doped GaN layer 12, the intermediate layer 13 and the n-type GaN contact and clad layer 14 are selectively removed. At this time, with regard to the n-type GaN contact and clad layer 14, etching is carried out up to the midway in the thickness direction.

Next, on top of the exposed surface of the supporting substrate 20, the p-side electrode 21 is formed. Furthermore, on top of the exposed surface of the n-type GaN contact and clad layer 14, the n-side electrode 22 is formed. Afterwards, the laminate from the p-side electrode 21 to the nitride multilayer film 11 is diced for the individual slice formation. In doing so, the semiconductor light emitting device 1 is manufactured.

Next, an explanation will be given with regard to the structure of the semiconductor light emitting device 1 according to the first embodiment after completion.

In the following, in the explanation of the structure, the explanation will be given with the light emitting layer 15 being "upper" than the supporting substrate 20. The description of this direction is reverse with respect to the explanation of the manufacturing method described above.

As shown in FIG. 2A and FIG. 2B, in the semiconductor light emitting device 1, the supporting substrate 20 including, for example, copper, is formed. On the entire side on the bottom side of the supporting substrate 20, the p-side electrode 21 is formed. On the supporting substrate 20, the bonding layer 19, the p-type GaN contact layer 17, the p-type AlGaN electron overflow preventing and cladding layer 16, the light emitting layer 15, the n-type GaN contact and clad layer 14, the intermediate layer 13, the un-doped GaN layer 12, and the nitride multilayer 11 are laminated in this sequence from the supporting substrate 20 side. The bonding layer 19 includes gold, for example. The light emitting layer 15 is a nitride semiconductor including InGaAlN, for example. The intermediate layer 13 is a super lattice layer including GaN and InGaN, for example.

In the nitride multilayer 11, the AlN layer 11c with a thickness of 52 nm, for example, the un-doped GaN layer 11b with a thickness of 46 nm, for example, and the buffer AlN layer 11a with a thickness of 52 nm, for example, are laminated in this sequence from the side of the bottom layer, and the buffer AlN layer 11a is exposed to the uppermost side of the semiconductor light emitting device 1. The exposed side of the buffer AlN layer 11a is the light extraction surface of the semiconductor light emitting device 1.

Furthermore, the top layer portion of the n-type GaN contact and clad layer 14, the intermediate layer 13, the un-doped GaN layer 12, and the nitride multilayer film 11 are removed selectively. The n-side electrode 22 is formed on the exposed side of the n-type GaN contact and clad layer 14, that is, on the top-side of the lower layer portion of the n-type GaN contact and clad layer 14.

In the following, an explanation will be given with regard to the thicknesses of various layers of the nitride multilayer film 11.

When the thickness of the buffer AlN layer 11a is $t_1$, the thickness of the un-doped GaN layer 11b is $t_2$, the thickness of the AlN layer 11c is $t_3$, the wavelength of the light emitted from the light emitting layer 15 is $\lambda$, the refractive index of the aluminum nitride (AlN) as the material of the buffer AlN layer 11a and the AlN layer 11c is $n_1$, and the refractive index of the gallium nitride (GaN) as the material of the un-doped GaN layer 11b is $n_2$, then $t_1$, $t_2$ and $t_3$ satisfy the following Equations 1 to 3:

$$t_1 = \lambda/4n_1 \quad \text{(Equation 1)}$$

$$t_2 = \lambda/4n_2 \quad \text{(Equation 2)}$$

$$t_3 = \lambda/4n_1 \quad \text{(Equation 3)}$$

Further, if the thickness of the pair including the buffer AlN layer 11a and the un-doped GaN layer 11b is t, then the following Equations 4 and 5 are satisfied:

$$t = \lambda/4n_1 + \lambda/4n_2 \quad \text{(Equation 4)}$$

$$t = t_1 + t_2 \quad \text{(Equation 5)}$$

An example of the values of various parameters will be given in the following description. The refractive index $n_1$ of AlN is 2.17, the refractive index $n_2$ of GaN is 2.47, and the wavelength $\lambda$ of the blue light emitted by the light emitting layer 15 is 450 nm. Therefore, the thickness $t_1$ of the buffer AlN layer 11a and the thickness $t_3$ of the AlN layer 11c are $t_1 = t_3 = 450/(4 \times 2.17) = 52$ nm, and the thickness $t_2$ of the un-doped GaN layer 11b is $t_2 = 450/(4 \times 2.47) = 46$ nm.

Next, an explanation will be given with regard to the effects of the first embodiment.

In the first embodiment, the silicon wafer 10 is used as the substrate for crystal growth. For the silicone substrate, in the same manner as the sapphire substrate, one with large non-matching characteristic of the crystal lattice with the nitride semiconductor layer and the thermal expansion coefficient difference is available at a low manufacturing cost for a large-diameter wafer. Owing to this, the manufacturing cost of the semiconductor light emitting device 1 can be reduced.

Furthermore, in the process of manufacturing the semiconductor light emitting device 1, the nitride multilayer film 11 is the base film of the laminate after the un-doped GaN layer 12. Specifically, the buffer AlN layer 11a of the nitride multilayer film 11 can suppress the diffusion of the silicon contained in the silicon wafer 10 to the un-doped GaN layer 12 side. Furthermore, since the nitride multilayer film 11 is formed from the AlN and GaN as the nitride semiconductors, the matching characteristic with the LED film 18 including the nitride semiconductor is high. Therefore, the laminate after the un-doped GaN layer 12 formed on the nitride multilayer film 11 has good crystallinity. In this manner, the nitride multilayer film 11 suppresses the diffusion of silicon as well as functions as the initial growth structure for the control of the lattice strain of the laminate after the un-doped GaN layer 12 caused by the lattice constant of the silicon wafer 10.

Furthermore, in the first embodiment, the buffer AlN layer 11a is formed on the silicon wafer 10. Since silicon can be etched at a high selection ratio with respect to AlN, in the process for removing the silicon wafer 10, the buffer AlN layer 11a can be used as a stopper layer. Therefore, the silicon wafer 10 can be removed easily and, at the same time, the buffer AlN layer 11a can remain virtually without adding the damage.

Furthermore, the nitride multilayer film 11 is formed on the topmost layer of the semiconductor light emitting device 1 after completion. Thus, if the thicknesses of the various layers of the nitride multilayer film 11 satisfy the mathematical equations 1 to 3, the nitride multilayer film 11 functions as an antireflection film. In doing so, the inside reflection of the light emitted from the light emitting layer 15 from the upper surface of the semiconductor light emitting device 1 and the return to the inside are suppressed. The light emitted from the light emitting layer 15 can be taken out efficiently to the outside of the semiconductor light emitting device 1. As a result, the semiconductor light emitting device with high light extraction efficiency can be realized. In one example, by the formation of the nitride multilayer film 11, in comparison to the case without the formation of the nitride multilayer film 11, the light extraction efficiency can be improved to about 1.2 times.

Furthermore, since the nitride multilayer film 11 is subjected to epitaxial growth on the silicon wafer, it has good crystallinity. Furthermore, as described above, since the nitride multilayer film 11 virtually does not receive damage in the process of removing the silicon wafer 10, it has high flatness. Therefore, the nitride multilayer film 11 is excellent in optical characteristics, high in reflection preventing performance and, at the same time, the light has a low loss during passage inside the nitride multilayer film 11.

In this manner, according to the first embodiment, in the manufacture of the semiconductor light emitting device 1, by using the initial growth structure of the nitride multilayer film 11, with the use of a low manufacturing cost silicon wafer having a large diameter that is easily formed as the substrate for crystal growth, the LED film 18 including the nitride semiconductor can be formed. Furthermore, in the semiconductor light emitting device 1 after completion, by removing the silicon wafer 10 to expose the nitride multilayer film 11, the nitride multilayer film 11 can be used as the antireflection film. As a result, the semiconductor light emitting device with good characteristics can be manufactured at a low cost.

In contrast to this, if a sapphire substrate or a GaN substrate is used as the substrate for crystal growth, the supply cost of the substrate for crystal growth is increased and, at the same time, it is difficult to remove the substrate for crystal growth selectively with respect to the nitride multilayer film 11. Therefore, the nitride multilayer film 11 will be damaged and the optical characteristics will decrease.

In order to increase the extraction efficiency by suppressing the inside reflection of light, the formation of an uneven surface on the topmost layer of the semiconductor light emitting device can also be considered. However, in this case, it is necessary to make the height of the uneven surface about the same as the wavelength of the light emitted from the light emitting layer 15. Thus, it is necessary to form a film for processing with a thickness of a few hundreds of nm. Furthermore, since the uneven surface is formed on this film for processing, the mask formation and the etching treatment are required. Therefore, if the unevenness is to be formed, the number of processes will increase and the manufacturing cost will increase. Furthermore, it is difficult to make an uneven structure compatible with the initial growth structure for the moderation of the lattice non-matching between the silicon wafer and the nitride semiconductor layer, and the difference in the thermal expansion coefficient.

In contrast to this, according to the first embodiment, in order to enable the diverted use of the initial growth structure required during manufacturing as such to the antireflection film, there is no increase in the number of processes. Therefore, an increase in the manufacturing cost can be suppressed.

In the first embodiment, the example of making the nitride multilayer film 11 of a three-layer film including the buffer AlN layer 11a, the un-doped GaN layer 11b and the AlN layer 11c has been shown, but it is not to be restricted to this. The pair including the buffer AlN layer 11a and the un-doped GaN layer 11b may also be laminated in multiple pairs.

Furthermore, in the first embodiment, the example of the formation of the buffer AlN layer 11a and the AlN layer 11c from aluminum nitride (AlN), and of the un-doped GaN layer 11b from gallium nitride (GaN) has been shown, but it is not to be restricted to this. As long as these layers are formed from nitride semiconductors, the lattice distortion between the silicon wafer 10 and the LED film 18 including the nitride semiconductor and the difference in thermal expansion coefficients can be moderated, and the crystallinity of the LED film 18 can be increased.

However, in order to prevent the diffusion of silicon (Si) in the silicon wafer 10, it is preferable that the buffer AlN layer 11a contains aluminum (Al). Thus, the buffer AlN layer 11a is formed with the nitride semiconductor containing aluminum. Furthermore, in order to make the nitride multilayer film 11 to function as an antireflection film, it is necessary for the refractive indexes of the adjacent layers to be mutually different. Therefore, it is necessary that the un-doped GaN layer 11b is formed with the nitride semiconductor that has a refractive index different from that of the buffer AlN layer 11a. From these reasons, the material of the buffer AlN layer 11a and the AlN layer 11c is preferably $Al_xGa_{1-x}N$ ($x \geq 0.5$), more preferably AlN. This is because the AlN has the lowest refractive index among the InGaAlN-type semiconductors. Furthermore, it is preferable that the material of the un-doped GaN layer 11b is GaN in order to increase the difference between the refractive indexes with the buffer AlN layer 11a.

Next, a second embodiment is described below.

Figure 3:
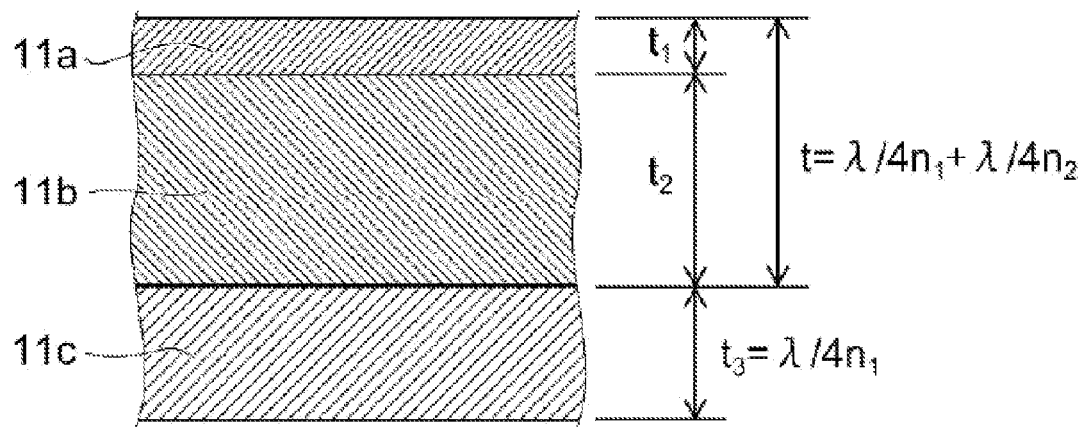
FIG. 3 is a cross-sectional diagram illustrating a nitride multilayer film of a semiconductor light emitting device according to an embodiment.

FIG. 3 is a cross-sectional diagram illustrating a nitride multilayer film of a semiconductor light emitting device according to the second embodiment. As shown in FIG. 3, like the first embodiment, the nitride multilayer film 11 of the second embodiment is formed by the lamination of the buffer AlN layer 11a, the un-doped GaN layer 11b and the AlN layer 11c in this sequence. The buffer AlN layer 11a, in the manufacturing process, is formed first on top of the silicon wafer 10 (refer to FIG. 1A) and, in the semiconductor light emitting device after the removal of the silicon wafer 10, constitutes the light extraction surface (the uppermost surface).

However, in the second embodiment, being different from the first embodiment described above, the thickness $t_1$ of the buffer AlN layer 11a and the thickness $t_2$ of the un-doped GaN layer 11b do not satisfy the Equations 1 and 2, respectively. However, the thicknesses $t_1$ and $t_2$ satisfy Equations 4 and 5. For example, the optical thickness of the pair including the buffer AlN layer 11a and the un-doped GaN layer 11b is a half of the wavelength λ. Furthermore, the thickness $t_3$ of the buffer AlN layer 11c satisfies the mathematical equation 3, for example, it is 52 nm.

According to the second embodiment, one thickness of the buffer AlN layer 11a and the un-doped GaN layer 11b can be selected to a certain extent. In this case, the other thickness is adjusted so that the mathematical equations 4 and 5 are satisfied. In the second embodiment, the thickness $t_1$ of the buffer AlN layer 11a is selected so that the crystal quality of the un-doped GaN layer 12 is optimal. An explanation will be given with regard to this case.

Figure 4:
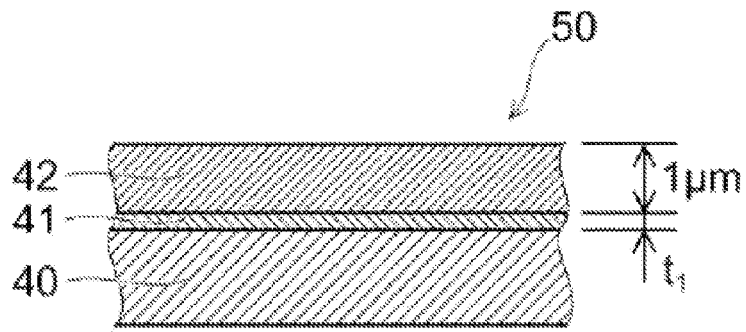
FIG. 4 is a cross-sectional diagram illustrating a sample for use in a test example of an embodiment.

FIG. 4 is a cross-sectional diagram showing a sample for use in a test example of the second embodiment.

Figure 5:
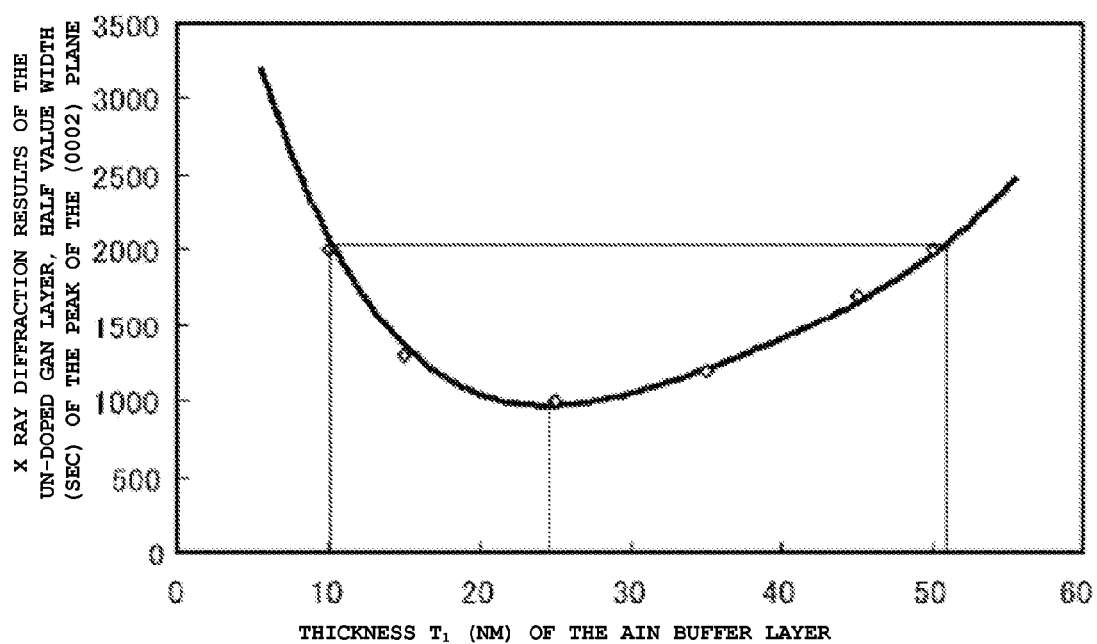
FIG. 5 is a graph diagram illustrating the example in which a thickness of a buffer AlN layer affects a crystal quality of an un-doped GaN layer.

FIG. 5 is a graph diagram illustrating an effect of the thickness $t_1$ of the buffer AlN layer on the crystal quality of the un-doped GaN layer, with the thickness $t_1$ of the buffer AlN layer taken on the abscissa and the half value width of the peak of the diffraction (e.g., (0002) diffraction) of the crystal C axis on the X ray diffraction curve of the un-doped GaN layer taken on the ordinate.

FIG. 5 shows the results by carrying out the X ray diffraction with respect to the sample shown in FIG. 4. With a decrease in the half value width shown in the ordinate of FIG. 5, the diffraction peak of the crystal C axis is sharper, the orientation characteristic of the un-doped GaN layer 12 is stronger, and the crystal quality is better.

As shown in FIG. 4, in the sample 50 used in this test example, on top of the silicon substrate 40, the buffer AlN layer 41 is formed by epitaxial growth. On top of it, the un-doped GaN layer 42 with a thickness of 1 μm is formed.

In this test example, multiple samples 50 with mutually different thicknesses $t_1$ of the buffer AlN layer 41 are prepared. The X ray diffraction is carried out to these samples 50. The half value widths of the peaks of the diffraction of the crystal C axis of the un-doped GaN layer 42, that is, the (0002) diffraction, are measured.

As shown in FIG. 5, the crystal quality of the un-doped GaN layer 42 depends on the thickness $t_1$ of the buffer AlN layer 41, and there exists an optimal value of the thickness $t_1$. In the test results shown in FIG. 5, the optimal value of the thickness $t_1$ is 25 nm. In this case, in order to satisfy the mathematical equations 4 and 5, the thickness $t_2$ of the un-doped GaN layer 42 is 73 nm. However, as shown in FIG. 5, if the thickness $t_1$ is more than 10 nm and less than 52 nm, with respect to the case in which the thickness $t_1$ is 52 nm to satisfy ($\lambda/4n_1$), the effect of improving the crystal quality of the un-doped GaN layer 42 can be achieved.

In the second embodiment, the optical thicknesses of the buffer AlN layer 11a and the thickness $t_2$ of the un-doped GaN layer 11b deviate respectively from (λ/4). However, the optical thicknesses of pair including the buffer AlN layer 11a and the un-doped GaN layer 11b is (λ/2). Furthermore, since the optical thickness of the buffer AlN layer 11c is (λ/4), the nitride multilayer film 11 can realize to a certain extent the function as an antireflection film.

Furthermore, in the second embodiment, in comparison to the first embodiment described above, the crystal quality of the un-doped GaN layer 12 and the laminate laminated above it is improved. Therefore, the light extraction efficiency is improved by this.

In the semiconductor light emitting device according to the second embodiment, in comparison to the case without the formation of the nitride multilayer film 11, the light extraction efficiency is 1.2 times. This is about the same as that of the semiconductor light emitting device according to the first embodiment described above. It is believed that this is because of the fact that, with respect to the first embodiment, the effect due to the deviation of the optical thicknesses of the buffer AlN layer 11a and the un-doped GaN layer 11b from (λ/4) and the effect due to the crystal quality of the un-doped GaN layer 12 and the laminate above it.

The constitution other than that described above, the manufacturing method and the effects in the second embodiment are the same as those of the first embodiment described above.

In the second embodiment, the example for one pair of the pair including the buffer AlN layer 11a and the un-doped GaN layer 11b has been shown. However, it is not restricted to this. Two or more pairs of this pair can also be laminated.

In the second embodiment, the example of the formation of the AlN layer 11c on the un-doped GaN layer 12 side has been shown. However, it is not restricted to this. For example, from the un-doped GaN layer 12 side, the buffer AlN layer 11a, the un-doped GaN layer 11b and the AlN layer 11c can also be laminated in sequence. The buffer AlN layer 11a, the un-doped GaN layer 11b, the buffer AlN layer 11a, the un-doped GaN layer 11b, . . . the buffer AlN layer 11a, the un-doped GaN layer 11b, and the AlN layer 11c may also be laminated.

Therefore, if the constitution of the nitride multilayer film 11 in the first and second embodiments is generally represented, it will be in following manner. For example, in the nitride multilayer film 11, k pairs (k is an integer of 1 or more) of the pair including the buffer AlN layer 11a and the un-doped GaN layer 11b are laminated. One layer of the AlN layer 11c is laminated on top of the exposed side of the un-doped GaN layer 11b in the laminate obtained by lamination in this manner. The thicknesses $t_1$, $t_2$ and $t_3$ of these layers satisfy the mathematical equations 3 to 5.

Furthermore, during the formation of such nitride multilayer film 11, the process of forming the buffer AlN layer 11a and the process of forming the un-doped GaN layer 11b are alternately repeated for k times each, and then the process of forming the AlN layer 11c is carried out. Or, after carrying out the formation of the AlN layer 11c, the process of forming the un-doped GaN layer 11b and the process of forming the buffer AlN layer 11a are alternately repeated for k times each.

However, even in these cases, it is preferable that the film forming condition of the growth initial period of the layer in contact with the silicon wafer 10 is the method explained in the first embodiment described above. For example, it is preferable that, as the raw material gas of the MOCVD, by supplying TMA at the beginning, the aluminum layer of the single atom layer is formed on the top-side of the silicon wafer 10. Next, by supplying ammonia, the nitrogen layer of the single atom layer is formed. Next, while ammonia is being supplied continuously, TMA is supplied intermittently. Then, by continuously supplying ammonia and TMA concurrently, the AlN layer is grown.

In each of the embodiments described above, the example for the emission of the blue light with a wavelength of 450 nm by the emitting layer 15 has been shown. However, it is not restricted to this. It is acceptable if the wavelength 2 of the light emitted by the emitting layer 15 and the thicknesses of the various layers of the nitride multilayer film 11 satisfy the mathematical equations 3 to 5. It is more preferable that the aforementioned mathematical equations 1 and 2 are also satisfied. However, the mathematical equations 1 to 4 are not intended to be mathematically rigorous; a discrepancy of ±10% is allowable. For example, as long as the discrepancy in the thicknesses $t_1$, $t_2$ and $t_3$ with respect to the mathematical equations 1 to 4 is less than ±10%, certain effectiveness can be obtained.

Furthermore, in each of the embodiments described above, the example of using the silicon wafer as the substrate for crystal growth has been shown. However, as the substrate for crystal growth, a silicon carbide (SiC) wafer can also be used.

Accordingly, a semiconductor light emitting device having high performance characteristics and a low manufacturing cost, and a manufacturing method thereof, are provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor light emitting device, comprising:
    performing epitaxial growth of a nitride multilayer film on an upper surface of a first substrate;
    forming a light emitting layer including a nitride semiconductor on an upper surface of the nitride multilayer film;
    joining a second substrate to an upper surface of a first laminate that includes the first substrate, the nitride multilayer film and the light emitting layer; and
    removing the first substrate to expose a lower surface of the nitride multilayer film, the nitride multilayer film being at an exposed surface of a second laminate that includes the second substrate, the light emitting layer, and the nitride multilayer film forming an antireflection layer for light emitted from the light emitting layer,
    wherein the epitaxial growth of the nitride multilayer film is performed by forming a first layer including a first nitride semiconductor containing aluminum, forming a second layer including a second nitride semiconductor with a refractive index different from the refractive index of the first nitride semiconductor, and forming a third layer including the first nitride semiconductor containing aluminum.

2. The method of claim 1, wherein the first substrate comprises one of a silicon substrate and a silicon nitride substrate.

3. The method of claim 1, wherein, during said performing the epitaxial growth of the nitride multilayer film, pairs of the first layer and the second layer are formed k times, where k is an integer of 1 or more, and thereafter the third layer is formed.

4. The method of claim 1, wherein, during said performing the epitaxial growth of the nitride multilayer film, the third layer is formed, and thereafter pairs of the second layer and the first layer are formed k times, where k is an integer of 1 or more.

5. The method of claim 1, wherein when a thickness of a pair including the first layer and the second layer is t, a thickness of the third layer is $t_3$, a wavelength of a light emitted from the light emitting layer is λ, a refractive index of the first nitride semiconductor is $n_1$, and a refractive index of the second nitride semiconductor is $n_2$, the following equations are satisfied:

$$t = \lambda/4n_1 + \lambda/4n_2, \text{ and}$$

$$t_3 = \lambda/4n_1.$$

6. The method of claim 5, wherein when a thickness of the first layer is $t_1$ and a thickness of the second layer is $t_2$, the following equations are satisfied:

$$t_1 = \lambda/4n_1, \text{ and}$$

$$t_2 = \lambda/4n_2.$$

7. The method of claim 1, wherein the first nitride semiconductor is $Al_xGa_{1-x}N$, $x \geq 0.5$, and the second nitride semiconductor is gallium nitride.

8. A semiconductor light emitting device, comprising:
   a substrate;
   a light emitting layer including a nitride semiconductor formed on a surface of the substrate; and
   a nitride multilayer film formed on the light emitting layer, the light emitting layer being between the surface of the substrate and the nitride multilayer film,
   wherein the nitride multilayer film is formed from a first layer including a first nitride semiconductor containing aluminum, a second layer including a second nitride semiconductor having a refractive index different from the refractive index of the first nitride semiconductor, and a third layer including the first nitride semiconductor containing aluminum, such that the nitride multilayer film includes laminated k pairs of the first layer and the second layer, where k is an integer of 1 or more, and the third layer disposed on a side of the nitride multilayer film apart from the light emitting layer, and
   wherein, when a thickness of the pair is t, a thickness of the third layer is $t_3$, a wavelength of a light emitted from the light emitting layer is $\lambda$, a refractive index of the first nitride semiconductor is $n_1$, and a refractive index of the second nitride semiconductor is $n_2$, the following equations are satisfied:

$t = \lambda/4n_1 + \lambda/4n_2$, and $t_3 = \lambda/4n_1$.

9. The semiconductor light emitting device of claim 8, wherein, when a thickness of the first layer is $t_1$ and a thickness of the second layer is $t_2$, the following equations are satisfied:

$t_1 = \lambda/4n_1$, and $t_2 = \lambda/4n_2$.

10. The semiconductor light emitting device of claim 8, wherein the first nitride semiconductor is $Al_xGa_{1-x}N$, $x \geq 0.5$, and the second nitride semiconductor is gallium nitride.

11. The semiconductor light emitting device of claim 8, further comprising:
    a gallium nitride layer between the light emitting layer and the nitride multilayer film.

12. The semiconductor light emitting device of claim 11, wherein the first layer includes aluminum nitride, and a thickness of the first layer is between 10 nm and 52 nm.

13. The semiconductor light emitting device of claim 11, further comprising:
    a super lattice layer including GaN and InGaN, between the light emitting layer and the gallium nitride layer.

14. A method of manufacturing a semiconductor light emitting device, comprising:
    bonding a first laminate including a semiconductor substrate, a nitride multilayer film formed on an upper surface of the semiconductor substrate, and a light emitting layer formed on an upper surface of the nitride multilayer film to a supporting substrate, the light emitting layer being between the supporting substrate and the nitride multilayer film; and
    removing the semiconductor substrate to expose a lower surface of the nitride multilayer film, the nitride multilayer film being at an exposed surface of a second laminate that includes the supporting substrate, the light emitting layer, and the nitride multilayer film forming an antireflection layer for light emitted from the light emitting layer,
    wherein the nitride multilayer film is formed from a first layer including a first nitride semiconductor containing aluminum, a second layer including a second nitride semiconductor having a refractive index different from the refractive index of the first nitride semiconductor, and a third layer including the first nitride semiconductor containing aluminum, such that the nitride multilayer film includes laminated k pairs of the first layer and the second layer, where k is an integer of 1 or more, and the third layer disposed on a side of the nitride multilayer film apart from the light emitting layer.

15. The method of claim 14, wherein the nitride multilayer film is epitaxially grown.

16. The method of claim 14, wherein the semiconductor substrate comprises one of a silicon substrate and a silicon nitride substrate.

17. The method of claim 14, wherein when a thickness of a pair including the first layer and the second layer is t, a thickness of the third layer is $t_3$, a wavelength of a light emitted from the light emitting layer is $\lambda$, a refractive index of the first nitride semiconductor is $n_1$, and a refractive index of the second nitride semiconductor is $n_2$, the following equations are satisfied:

$t = \lambda/4n_1 + \lambda/4n_2$, and $t_3 = \lambda/4n_1$.

18. The method of claim 14, wherein when a thickness of the first layer is $t_1$ and a thickness of the second layer is $t_2$, the following equations are satisfied:

$t_1 = \lambda/4n_1$, and $t_2 = \lambda/4n_2$.

19. The method of claim 14, wherein the first nitride semiconductor is $Al_xGa_{1-x}N$, $x \geq 0.5$, and the second nitride semiconductor is gallium nitride.

20. A semiconductor light emitting device, comprising:
    a substrate;
    a light emitting layer including a nitride semiconductor formed on a surface of the substrate;
    a nitride multilayer film formed on the light emitting layer, the light emitting layer being between the surface of the substrate and the nitride multilayer film;
    a gallium nitride layer between the light emitting layer and the nitride multilayer film; and
    a super lattice layer including GaN and InGaN, between the light emitting layer and the gallium nitride layer,
    wherein the nitride multilayer film is formed from a first layer including a first nitride semiconductor containing aluminum, a second layer including a second nitride semiconductor having a refractive index different from the refractive index of the first nitride semiconductor, and a third layer including the first nitride semiconductor containing aluminum, such that the nitride multilayer film includes laminated k pairs of the first layer and the second layer, where k is an integer of 1 or more, and the third layer disposed on a side of the nitride multilayer film apart from the light emitting layer.

* * * * *